United States Patent
Jung

(10) Patent No.: US 9,001,612 B2
(45) Date of Patent: Apr. 7, 2015

(54) SEMICONDUCTOR MEMORY DEVICE AND OPERATION METHOD THEREOF

(75) Inventor: Jong-Ho Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 427 days.

(21) Appl. No.: 13/444,981

(22) Filed: Apr. 12, 2012

(65) Prior Publication Data

US 2013/0163366 A1    Jun. 27, 2013

(30) Foreign Application Priority Data

Dec. 22, 2011   (KR) ........................ 10-2011-0140231

(51) Int. Cl.
  G11C 8/00     (2006.01)
  G11C 7/22     (2006.01)
  G11C 11/4076  (2006.01)
  G11C 11/4093  (2006.01)
  G11C 7/10     (2006.01)

(52) U.S. Cl.
  CPC .. *G11C 7/22* (2013.01); *G11C 8/00* (2013.01); *G11C 11/4076* (2013.01); *G11C 11/4093* (2013.01); *G11C 7/1066* (2013.01); *G11C 7/222* (2013.01)

(58) Field of Classification Search
  CPC ........ G11C 7/22; G11C 7/222; G11C 7/1066; G11C 11/4076; G11C 11/4093; G11C 8/00

USPC ............ 365/233.1, 233, 12, 233.13, 193, 194
  See application file for complete search history.

(56) References Cited

U.S. PATENT DOCUMENTS

| | | | |
|---|---|---|---|
| 2008/0232180 A1* | 9/2008 | Kim et al. | 365/194 |
| 2009/0251187 A1* | 10/2009 | Shin | 327/286 |
| 2010/0008167 A1* | 1/2010 | Shin | 365/194 |
| 2010/0277992 A1* | 11/2010 | Noh | 365/189.14 |
| 2010/0315139 A1* | 12/2010 | Kim et al. | 327/158 |

FOREIGN PATENT DOCUMENTS

KR          100931026          12/2009

* cited by examiner

*Primary Examiner* — Toan Le
(74) *Attorney, Agent, or Firm* — IP & T Group LLP

(57) ABSTRACT

A semiconductor memory device includes a delay locked loop configured to generate a delay locked loop (DLL) clock signal by delaying an external clock signal by a first delay time and generate a feedback clock signal by delaying the DLL clock signal by the second delay time, wherein the first delay time corresponds to a phase difference between the external clock signal and the feedback clock signal and an output enable control circuit configured to generate an output enable signal in response to CAS latency information and the first and second delay times after the delay locked loop performs a locking operation.

13 Claims, 3 Drawing Sheets

SEMICONDUCTOR MEMORY DEVICE AND OPERATION METHOD THEREOF

CROSS-REFERENCE TO RELATED APPLICATIONS

The present application claims priority of Korean Patent Application No. 10-2011-0140231, filed on Dec. 22, 2011, which is incorporated herein by reference in its entirety.

BACKGROUND

1. Field

Exemplary embodiments of the present invention relate to a semiconductor designing technology, and more particularly, to a semiconductor memory device that generates an output enable signal used for a read operation.

2. Description of the Related Art

Generally, semiconductor memory devices including a Double Data Rate Synchronous Dynamic Random Access Memory (DDR SDRAM) receive a command signal and an external clock signal from an external controller and perform diverse operations. For example, at a read operation, a semiconductor memory device outputs a data synchronized with an internal clock signal in response to a read command. The semiconductor memory device may include a circuit for generating the internal clock signal by coinciding the operation timings of the external clock signal and the internal clock signal with each other and use the internal clock signal in performing the diverse operations. A Delay Locked Loop (DLL) and an output enable controller may serve as such a circuit.

First, a delay lock loop generates an internal clock signal by delaying an external clock signal by a set time. Generally, the semiconductor memory device takes some delay time to transfer a clock signal. Therefore, the semiconductor memory device generates an internal clock signal by compensating for the delay time to an external clock signal, and such an operation of the semiconductor memory device is referred to as 'locking'.

Secondly, the output enable controller synchronizes a read command synchronized with an external clock signal, with an internal clock signal. The clock signal, that a read command is synchronized with, is changed from the external clock signal to the internal clock signal, and the change of a synchronization signal from one clock signal to another clock signal is referred to as 'domain crossing'. The output enable controller performs the domain crossing operation to generate an output enable signal. The output enable signal includes, for example, CAS latency information CL. Here, the CAS latency information CL may represent time information from a moment, when a read command is applied, to a moment, when a data is to be outputted, by taking one period of the external clock signal as a unit time.

The semiconductor memory device operates in such a manner that a data to be synchronized with the external clock signal is outputted at a desired moment after the receipt of the read command by using the delay lock loop and the output enable controller.

FIG. 1 is a block diagram illustrating an output enable controller of a conventional semiconductor memory device.

Referring to FIG. 1, the output enable controller includes a counter reset signal generation unit 110, an initialization unit 120, a DLL clock counting unit 130, a delay unit 140, an external clock counting unit 150, a count value latch unit 160, and a count value comparison unit 170.

The counter reset signal generation unit 110 synchronizes a reset signal RST with a DLL clock signal CLK_DLL and generates a first reset signal RST_DLL for resetting the DLL clock counting unit 130.

The initialization unit 120 provides the DLL clock counting unit 130 with an initial count value INT<0:2> that corresponds to CAS latency information CL. For example, a 3-bit code signal is used as the initial count value INT<0:2> in FIG. 1. The following Table 1 shows initial counting setup values and the initial count value INT<0:2>, wherein the initial counting setup values are set in response to CAS latency information CL 3 to CL 6 and the initial count value INT<0:2> is outputted from the initialization unit 120 in response to the initial counting setup values.

TABLE 1

| CL | initial counting setup value | INT<2> | INT<1> | INT<0> |
|----|------------------------------|--------|--------|--------|
| 3  | 5                            | 1      | 0      | 1      |
| 4  | 4                            | 1      | 0      | 0      |
| 5  | 3                            | 0      | 1      | 1      |
| 6  | 2                            | 0      | 1      | 0      |

In Table 1, the initial counting setup value and the initial count value INT<0:2> may be differently set to the CAS latency information CL depending on the configuration and the circuit design of the semiconductor memory device.

The DLL clock counting unit 130 performs a counting operation in response to the first reset signal RST_DLL. In other words, the DLL clock counting unit 130 outputs a DLL clock count value CNT_DLL<0:2> that is counted from the initial count value INT<0:2> in response to the DLL clock signal CLK_DLL based on the first reset signal RST_DLL. For example, when the initial count value INT<0:2>, i.e., the initial counting setup value, is set to 4 based on the CAS latency information CL, the DLL clock counting unit 130 outputs a DLL clock count value CNT_DLL<0:2> that is counted from 4 in response to the DLL clock signal CLK_DLL. For example, a typical 3-bit counter may be used as the DLL clock counting unit 130.

The delay unit 140 models the extent of delay between the DLL clock signal CLK_DLL and an external clock signal CLK_EXT. The delay unit 140 delays the first reset signal RST_DLL and outputs a second reset signal RST_EXT.

The external clock counting unit 150 performs a counting operation in response to the second reset signal RST_EXT. In short, the external clock counting unit 150 outputs an external clock count value CNT_EXT<0:2> that is counted in response to the external clock signal CLK_EXT based on the second reset signal RST_EXT. The initial count value of the external clock counting unit 150 is set to '0' differently from that of the DLL clock counting unit 130. In other words, after the second reset signal RST_EXT is enabled, the external clock count value CNT_EXT<0:2> is counted from '0' in response to the external clock signal CLK_EXT. Here, a general 3-bit counter may be used as the external clock counting unit 150 the same as the DLL clock counting unit 130.

The count value latch unit 160 latches the external clock count value CNT_EXT<0:2> in response to a read command signal RD and outputs a latched external clock count value LAT_CNT<0:2>. The read command signal RD is a pulse signal that is synchronized with the external clock signal CLK_EXT and enabled in response to the applied read command.

The count value comparison unit 170 compares the DLL clock count value CNT_DLL<0:2> with the latched external clock count value LAT_CNT<0:2> and generates an output enable signal OE that is enabled at a moment when the two values become the same. The output enable signal OE is a signal synchronized with the DLL clock signal CLK_DLL, and it is a resultant signal obtained by synchronizing the read command signal RD inputted in synchronization with the external clock signal CLK_EXT with the DLL clock signal CLK_DLL. The output enable signal OE also reflects the CAS latency information CL.

Meanwhile, high-speed, light-weight, and low-power of semiconductor memory devices are being developed to satisfy consumers' needs. The conventional output enable controller, however, may obstruct the development of high-speed light-weight, and low-power semiconductor memory devices.

In the first place, as the operation frequency of a semiconductor memory device increases, the CAS latency value increases as well. A counter that constitutes the DLL clock counting unit 130 and the external clock counting unit 150 is designed depending on the CAS latency value. In short, when the CAS latency value becomes great, the counter also is to be designed to count the great number. For example, 4-bit counter operates more slowly than a 3-bit counter, and the operation speed of the counter becomes slow as the CAS latency value increases. Also, the count value comparison unit 170 also operates slowly as the number of bits to be compared is increased. This obstructs the high-speed operation of the semiconductor memory device.

Also, a counter occupies a relatively greater area than other circuits. Therefore, as the CAS latency value increases, the area of the counter increases as well, and this obstructs the development of small semiconductor memory devices.

Next, since the conventional output enable controller has a structure of latching the external clock count value CNT_EXT<0:2> at a moment when the read command signal RD is enabled, the DLL clock counting unit 130 and the external clock counting unit 150 are to perform a counting operation at least until the read command signal RD is enabled. In short, a counter that receives the external clock signal CLK_EXT and a counter that receives the DLL clock signal CLK_DLL continue to perform the counting operation until a read command is applied. This means that power may be continuously consumed until the read command is applied, and this may obstruct the implementation of low-power semiconductor memory devices.

SUMMARY

An embodiment of the present invention is directed to a semiconductor memory device that generates an output enable signal using a counter of a minimized structure.

In accordance with an exemplary embodiment of the present invention, a semiconductor memory device includes a delay locked loop configured to generate a delay locked loop (DLL) clock signal by delaying an external clock signal by a first delay time and generate a feedback clock signal by delaying the DLL clock signal by a second delay time, wherein the first delay time corresponds to a phase difference between the external clock signal and the feedback clock signal, and an output enable control circuit configured to generate an output enable signal in response to CAS latency information and the first and second delay times after the delay locked loop performs a locking operation.

In accordance with another exemplary embodiment of the present invention, a semiconductor memory device includes a first variable delay line configured to generate a delay locked loop (DLL) clock signal by delaying an external clock signal in response to a delay control signal, a reset control unit configured to generate a first reset signal and a counter enabling signal in response to a locking information, a second variable delay line configured to generate a second reset signal by delaying the first reset signal by a first delay time of the first variable delay line, a delay replica modeling unit configured to selectively delay the DLL clock signal and the second reset signal by a second time in response to the counter enabling signal to be outputted as a feedback clock signal and a third reset signal, respectively, a phase detection unit configured to detect a phase of the external clock signal and a phase of the feedback clock signal, a control signal generation unit configured to generate the delay control signal and the locking information in response to an output signal of the phase detection unit, a counting unit configured to generate a count value corresponding to a duration that is defined in response to the first reset signal and the third reset signal, and an output enable signal generation unit configured to generate an output enable signal in response to the count value and CAS latency information.

In accordance with yet another exemplary embodiment of the present invention, a method for operating a semiconductor memory device includes delaying an input signal inputted through a predetermined input terminal by a modeled time, generating a delay locked loop (DLL) clock signal by inputting the DLL clock signal to the set input terminal as the input signal in a locking operation duration, and generating an output enable signal by inputting a reset signal to the set input terminal as the input signal in an output enable signal generation duration.

In accordance with yet another exemplary embodiment of the present invention, a method for operating a semiconductor memory device includes, generating a delay locked loop (DLL) clock signal by delaying an external clock signal by a first delay time and generating a feedback clock signal by delaying the DLL clock signal by the second delay time using a delay locked loop, wherein the first delay time corresponds to a phase difference between the external clock signal and the feedback clock signal, and generating an output enable signal in response to CAS latency information and the first and second delay times after the delay locked loop performs a locking operation.

DETAILED DESCRIPTION

Figure 1:
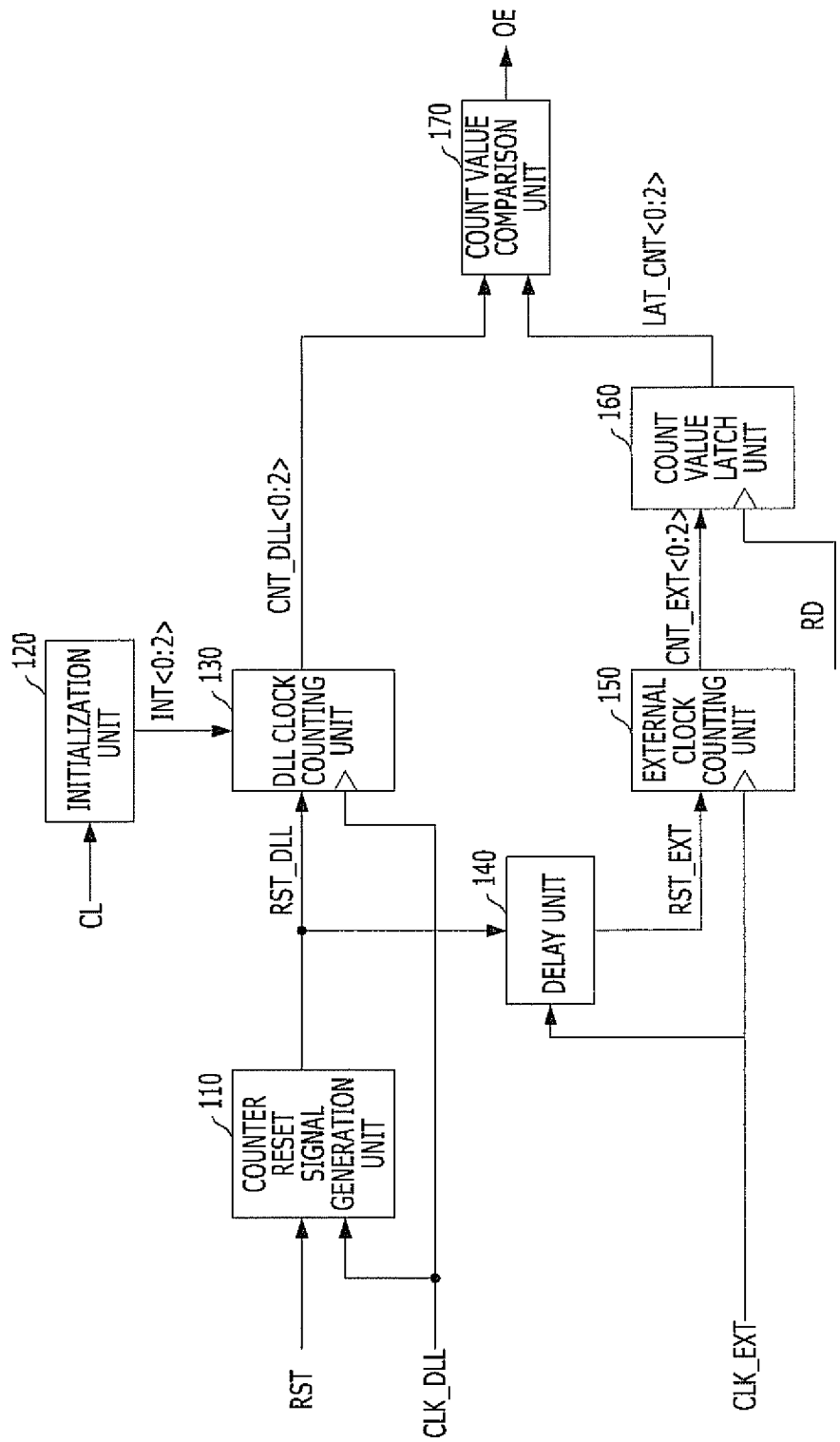
FIG. 1 is a block diagram illustrating an output enable controller of a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
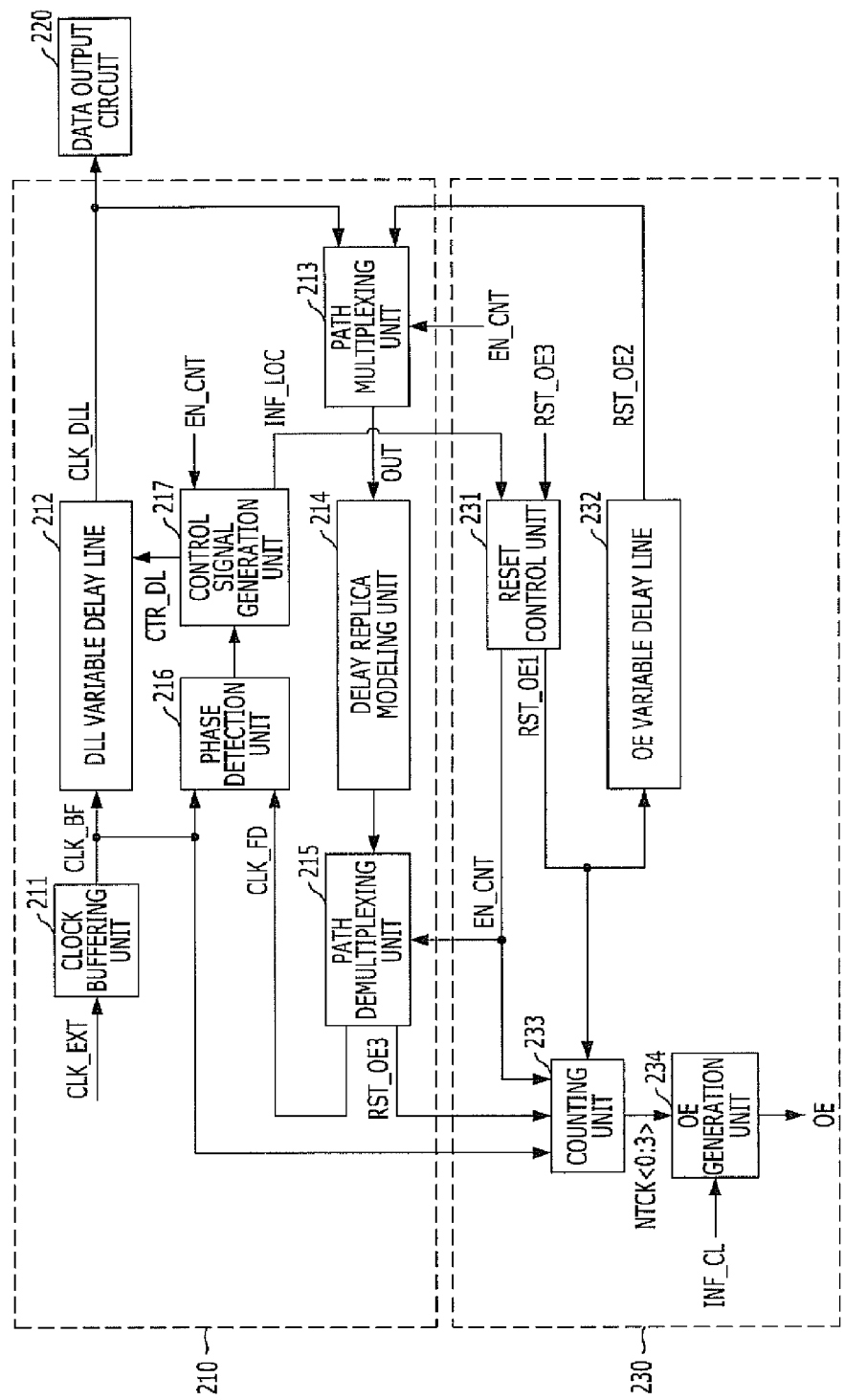
FIG. 2 is a block diagram illustrating a portion of a semiconductor memory device in accordance with an exemplary embodiment of the present invention.

FIG. 2 is a block diagram illustrating a portion of a semiconductor memory device in accordance with an exemplary embodiment of the present invention.

Referring to FIG. 2, the semiconductor memory device includes a delay locked loop 210, a data output circuit 220, and an output enable control circuit 230.

The delay locked loop 210 receives an external clock signal CLK_EXT and generates a DLL clock signal CLK_DLL, which is used as an internal clock signal. The delay locked loop 210 includes a clock buffering unit 211, a DLL variable delay line 212, a path multiplexing unit 213, a delay replica modeling unit 214, a path demultiplexing unit 215, a phase detection unit 216, and a control signal generation unit 217.

The clock buffering unit 211 generates a buffered clock signal CLK_BF by buffering the external clock signal CLK_EXT. The DLL variable delay line 212 generates the DLL clock signal CLK_DLL by delaying the buffered clock signal CLK_BF by a set time corresponding to a delay control signal CTR_DL. The data output circuit 220 outputs a data in response to the generated DLL clock signal CLK_DLL.

Subsequently, the path multiplexing unit 213 selectively outputs the DLL clock signal CLK_DLL and a second output enable reset signal RST_OE2 as an output signal OUT in response to a counter enabling signal EN_CNT. The delay replica modeling unit 214 delays the output signal OUT by a modeled time substantially equal to an actual delay time through a clock path and outputs a delayed signal. The path demultiplexing unit 215 receives the delayed signal of the delay replica modeling unit 214 and outputs a feedback clock signal CLK_FD or a third output enable reset signal RST_OE3 in response to the counter enabling signal EN_CNT. The phase detection unit 216 detects the phases of the buffered clock signal CLK_BF and the feedback clock signal CLK_FD. The control signal generation unit 217 generates the delay control signal CTR_DL based on the phase detection result. The delay locked loop 210 performs a locking operation with its elements described above. After the locking operation of the delay locked loop 210 is complete, the control signal generation unit 217 activates and outputs locking information INF_LOC.

Meanwhile, the output enable control circuit 230 generates an output enable signal OE in response to CAS latency information INF_CL and the delay time reflected in the delay locked loop 210 after the locking operation of the delay locked loop 210. The output enable control circuit 230 includes a reset control unit 231, an output enable signal (OE) variable delay line 232, a counting unit 233, and an output enable signal (OE) generation unit 234.

The reset control unit 231 generates the counter enabling signal EN_CNT activated in response to the locking information INF_LOC and inactivated in response to the third output enable reset signal RST_OE3, and outputs a first output enable reset signal RST_OE1 in synchronization with the DLL clock signal CLK_DLL. The OE variable delay line 232 delays the first output enable reset signal RST_OE1 by a modeled time and outputs the second output enable reset signal RST_OE2.

The counting unit 233 generates a count value NTCK<0: 3>, which corresponds to a duration defined by the first output enable reset signal RST_OE1 and the third output enable reset signal RST_OE3, in response to the counter enabling signal EN_CNT. The OE generation unit 234 generates the output enable signal OE in response to the count value NTCK<0:3> and the CAS latency information INF_CL.

Figure 3:
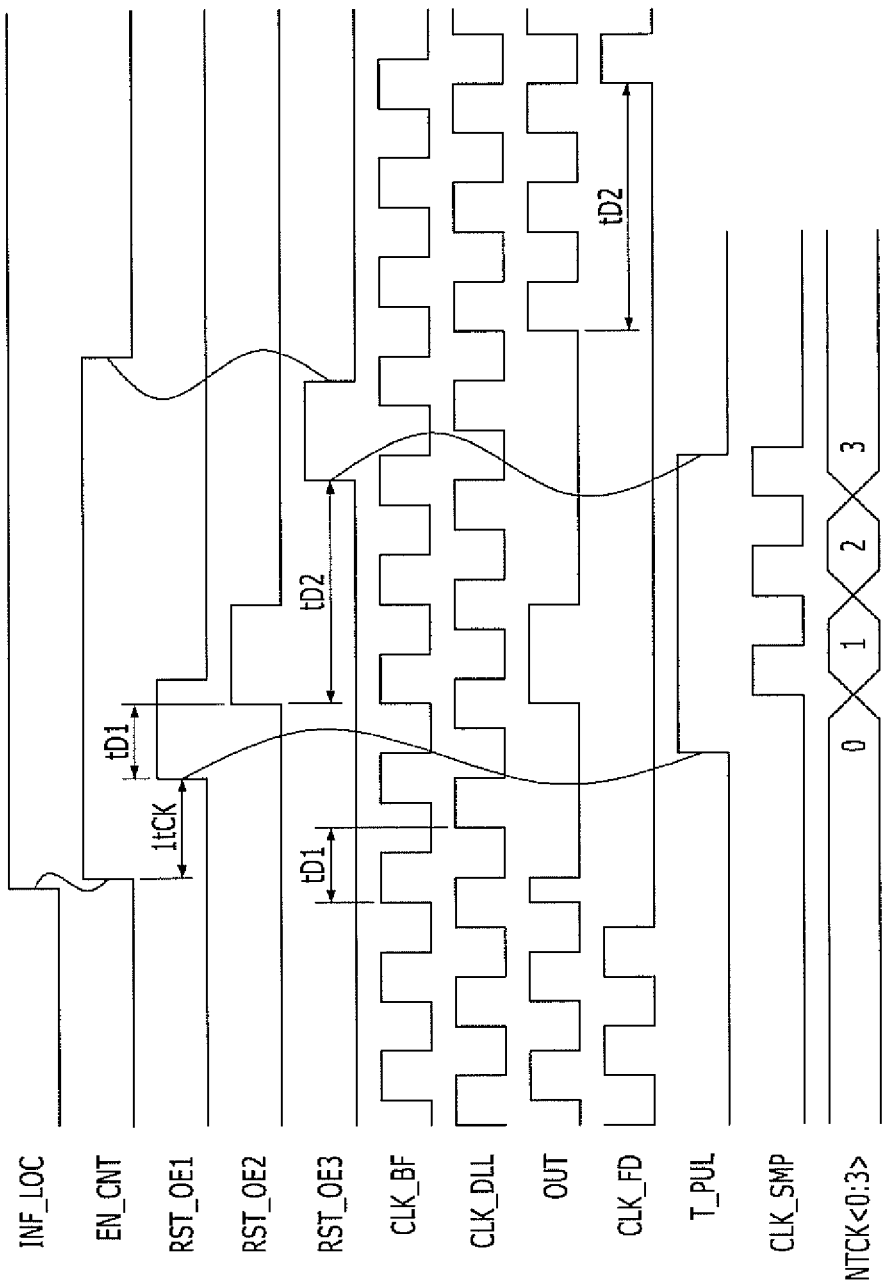
FIG. 3 is a timing diagram describing a simple circuit operation of the semiconductor memory device in accordance with an exemplary embodiment of the present invention.

FIG. 3 is a timing diagram describing a simple circuit operation of the semiconductor memory device in accordance with an embodiment of the present invention.

Hereinafter, the operation of the semiconductor memory device shown in FIGS. 2 and 3 is briefly described.

The semiconductor memory device in accordance with the exemplary embodiment of the present invention generates the output enable signal OE after a locking operation is performed. The duration that the locking operation is performed is referred to as a 'locking operation duration', and the duration that the output enable signal OE is generated is referred to as an 'output enable signal (OE) generation duration'.

First, in the locking operation duration, the clock buffering unit 211 buffers an external clock signal CLK_EXT and outputs a buffered clock signal CLK_BF. The DLL variable delay line 212 reflects the delay time corresponding to a delay control signal CTR_DL in the buffered clock signal CLK_BF and generates a DLL clock signal CLK_DLL. As illustrated in FIG. 3, the DLL clock signal CLK_DLL is a signal obtained by delaying the buffered clock signal CLK_BF by a first delay time tD1 which is reflected in the DLL variable delay line 212.

Meanwhile, the path multiplexing unit 213 outputs the DLL clock signal CLK_DLL as the output signal OUT in response to the counter enabling signal EN_CNT. The delay replica modeling unit 214 delays the output signal OUT by a modeled time and outputs a delayed signal. The counter enabling signal EN_CNT in accordance with the exemplary embodiment of the present invention is used as a signal for distinguishing the locking operation duration and the OE generation duration from each other.

Subsequently, the path demultiplexing unit 215 receives the output signal of the delay replica modeling unit 214 and outputs a feedback clock signal CLK_FD in response to the counter enabling signal EN_CNT. As shown in FIG. 3, the feedback clock signal CLK_FD is a signal obtained by delaying the output signal OUT of the path multiplexing unit 213, which is the DLL clock signal CLK_DLL, by a second delay time tD2 that is reflected in the delay replica modeling unit 214. The phase detection unit 216 detects the phases of the generated feedback clock signal CLK_FD and the buffered clock signal CLK_BF, and the control signal generation unit 217 generates a delay control signal CTR_DL corresponding to the detection result.

The delay locked loop 210 performs an update operation at a set period. The control signal generation unit 217 in accordance with the exemplary embodiment of the present invention obstructs the update operation of the delay locked loop 210 in response to the counter enabling signal EN_CNT. In other words, the delay locked loop 210 does not perform the update operation in the OE generation duration.

As described above, the semiconductor memory device in accordance with the exemplary embodiment of the present invention generates the DLL clock signal CLK_DLL by using the delay locked loop 210, which includes the DLL variable delay line 212, the path multiplexing unit 213, the delay replica modeling unit 214, the path demultiplexing unit 215, the phase detection unit 216, and the control signal generation unit 217, in the locking operation duration.

Subsequently, after the locking operation of the delay locked loop 210 is completed, the locking information INF_LOC is activated to a logic high level.

The reset control unit 231 receives the locking information INF_LOC from the control signal generation unit 217 in the OE generation duration to enable the counter enabling signal EN_CNT and generates the first output enable reset signal RST_OE1 synchronized with the DLL clock signal CLK_DLL. The OE variable delay line 232 generates the second output enable reset signal RST_OE2 by reflecting the first delay time tD1 in the first output enable reset signal RST_OE1. As illustrated in FIG. 3, the second output enable reset signal RST_OE2 is a signal obtained by delaying the first output enable reset signal RST_OE1 by the first delay time tD1.

Meanwhile, the path multiplexing unit 213 outputs the second output enable reset signal RST_OE2 in response to the counter enabling signal EN_CNT. The delay replica modeling unit 214 delays the output signal OUT by a modeled time and outputs a delayed signal. The semiconductor memory device in accordance with the exemplary embodiment of the present invention may use the delay replica modeling unit 214 in the locking operation duration and in the OE generation duration.

The path demultiplexing unit 215 receives the output signal of the delay replica modeling unit 214 and outputs a third output enable reset signal RST_OE3 in response to the counter enabling signal EN_CNT. As shown in FIG. 3, the third output enable reset signal RST_OE3 is a signal obtained by delaying the output signal OUT of the path multiplexing unit 213, which is the second output enable reset signal RST_OE2, by a second delay time tD2.

Meanwhile, the counting unit 233 generates a pulse signal T_PUL having a pulse width corresponding to the first output enable reset signal RST_OE1 and the third output enable reset signal RST_OE3 in a duration that the counter enabling signal EN_CNT is enabled, and generates the count value NTCK<0:3> by using the pulse signal T_PUL (not shown in FIG. 2) and counting a sampling clock signal CLK_SMP (not shown in FIG. 2) obtained by sampling the buffered clock signal CLK_BF. Lastly, the OE generation unit 234 performs a logic operation on the count value NTCK<0:3> and the CAS latency information INF_CL and generates an output enable signal OE in response to a read command RD. FIG. 3 shows an example that the sampling clock signal CLK_SMP toggles three times.

The counting unit 233 in accordance with the exemplary embodiment of the present invention performs a counting operation during a delay time reflected in the delay locked loop 210, which is a duration corresponding to the first delay time tD1 and the second delay time tD2. In short, since the counting unit 233 is to perform the counting operation for the duration corresponding to the first delay time tD1 and the second delay time tD2 regardless of the increase in the CAS latency value, the size of a counter may be minimized.

As described above, the semiconductor memory device in accordance with the exemplary embodiment of the present invention generates the output enable signal OE by using the reset control unit 231, the OE variable delay line 232, the path multiplexing unit 213, the delay replica modeling unit 214, the path demultiplexing unit 215, the counting unit 233, and the OE generation unit 234 in the OE generation duration.

As described above, the semiconductor memory device in accordance with the exemplary embodiment of the present invention may have a counter of a minimal size, the semiconductor memory device may be miniaturized and operate at a high speed with low-power consumption. Also, since it uses one delay replica modeling unit 214 in the locking operation duration and the OE generation duration, the circuit area may be reduced.

While the present invention has been described with respect to the specific embodiments, it will be apparent to those skilled in the art that various changes and modifications may be made without departing from the spirit and scope of the invention as defined in the following claims.

Also, although the above embodiment shows that one delay replica modeling unit is used in the locking operation duration and the OE generation duration, one variable delay line may be used in different operation durations as well.

What is claimed is:

1. A semiconductor memory device comprising:
a delay locked loop configured to generate a delay locked loop (DLL) clock signal by delaying an external clock signal by a first delay time and generate a feedback clock signal by delaying the DLL clock signal by a second delay time, wherein the first delay time corresponds to a phase difference between the external clock signal and the feedback clock signal; and
an output enable control circuit configured to generate an output enable signal in response to CAS latency information and the first and second delay times after the delay locked loop performs a locking operation,
wherein the delay locked loop includes a delay replica modeling unit configured to generate the feedback clock signal by delaying the DLL clock signal. wherein the output enable control circuit shares the delay replica modeling unit to generate the output enable signal.

2. The semiconductor memory device of claim 1, wherein the second delay time is substantially equal to an actual delay time through a clock path of the semiconductor memory device.

3. The semiconductor memory device of claim 1, wherein the output enable control circuit includes:
a counting unit configured to generate a count value determined by the first and second delay times after the delay locked loop performs a locking operation; and
an output enable signal generation unit configured to generate the output enable signal in response to the count value and CAS latency information.

4. A semiconductor memory device comprising:
a first variable delay line configured to generate a delay locked loop (DLL) clock signal by delaying an external clock signal in response to a delay control signal;
a reset control unit configured to generate a first reset signal and a counter enabling signal in response to a locking information;
a second variable delay line configured to generate a second reset signal by delaying the first reset signal by a first delay time of the first variable delay line;
a delay replica modeling unit configured to selectively delay the DLL clock signal and the second reset signal by a second time in response to the counter enabling signal to be outputted as a feedback clock signal and a third reset signal, respectively;
a phase detection unit configured to detect a phase of the external clock signal and a phase of the feedback clock signal;
a control signal generation unit configured to generate the delay control signal and the locking information in response to an output signal of the phase detection unit;
a counting unit configured to generate a count value corresponding to a duration that is defined in response to the first reset signal and the third reset signal; and
an output enable signal generation unit configured to generate an output enable signal in response to the count value and CAS latency information.

5. The semiconductor memory device of claim 4, wherein the first reset signal is synchronized with the DLL clock signal.

6. The semiconductor memory device of claim 4, wherein the delay replica modeling unit includes:
a path multiplexing unit configured to selectively output the DLL clock signal and the second reset signal in response to the counter enabling signal; and a path demultiplexing unit configured to selectively output the feedback clock signal to the phase detection unit and the third reset signal to the counting unit in response to the counter enabling signal.

7. The semiconductor memory device of claim 4, wherein the counting unit is enabled in response to the counter enabling signal, performs a counting operation in response to the first reset signal, and stops the counting operation in response to the third reset signal.

8. The semiconductor memory device of claim 4, wherein the control signal generation unit is configured to prevent the first variable delay line from updating the first delay time by generating the locking information.

9. A method for operating a semiconductor memory device, comprising:
    delaying an input signal inputted through a set input terminal by a modeled time;
    generating a delay locked loop (DLL) clock signal by inputting the DLL clock signal to the set input terminal as the input signal in a locking operation duration; and
    generating an output enable signal by inputting a reset signal to the set input terminal as the input signal in an output enable signal generation duration.

10. The method of claim 9, wherein the generating of the DLL clock signal includes:
    detecting a phase difference between an external clock signal and a feedback clock signal to produce a phase difference detection result;
    delaying the external clock signal by a delay time corresponding to the phase difference detection result and outputting the DLL clock signal; and
    delaying the DLL clock signal by the modeled time and outputting the feedback clock signal.

11. The method of claim 10, wherein the generating of the output enable signal includes:
    performing a counting operation for the modeled time and the delay time of the external clock signal to produce a counting operation output value; and
    enabling the output enable signal in response to CAS latency information and the counting operation output value.

12. A method for operating a semiconductor memory device, comprising:
    generating a delay locked loop (DLL) clock signal by delaying an external clock signal by a first delay time and generating a feedback clock signal by delaying the DLL clock signal by the second delay time using a delay replica modeling unit included in a delay locked loop, wherein the first delay time corresponds to a phase difference between the external clock signal and the feedback clock signal; and
    generating an output enable signal in response to CAS latency information and the first and second delay times after the delay locked loop performs a locking operation using the delay replica modeling unit.

13. The method of claim 12, wherein the second delay time is substantially equal to an actual delay time through a clock path of the semiconductor memory device.

* * * * *